(12) United States Patent
Bu et al.

(10) Patent No.: US 8,097,520 B2
(45) Date of Patent: Jan. 17, 2012

(54) INTEGRATION OF PASSIVE DEVICE STRUCTURES WITH METAL GATE LAYERS

(75) Inventors: Huiming Bu, Albany, NY (US); Satya N. Chakravarti, Hopewell Junction, NY (US); Dechao Guo, Hopewell Junction, NY (US); Keith Kwong Hon Wong, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 12/543,544

(22) Filed: Aug. 19, 2009

(65) Prior Publication Data

US 2011/0042786 A1    Feb. 24, 2011

(51) Int. Cl.
*H01L 27/02* (2006.01)

(52) U.S. Cl. ........ 438/381; 438/382; 257/379; 257/380; 257/536

(58) Field of Classification Search .................. None
See application file for complete search history.

(56) References Cited

U.S. PATENT DOCUMENTS

| | | | |
|---|---|---|---|
| 4,404,581 A | 9/1983 | Tam et al. | |
| 4,604,641 A | 8/1986 | Konishi | |
| 4,878,770 A | 11/1989 | Ruggerio et al. | |
| 5,043,295 A | 8/1991 | Ruggerio et al. | |
| 5,116,770 A | 5/1992 | Kameyama et al. | |
| 5,189,284 A | 2/1993 | Takahashi et al. | |
| 5,236,851 A | 8/1993 | Kameyama et al. | |
| 5,465,005 A | 11/1995 | Eklund et al. | |
| 5,530,418 A | 6/1996 | Hsu et al. | |
| 5,585,663 A | 12/1996 | Bezama et al. | |
| 5,622,892 A | 4/1997 | Bezama et al. | |
| 5,838,044 A | 11/1998 | Chang et al. | |
| 6,013,940 A | 1/2000 | Harada et al. | |
| 6,100,746 A | 8/2000 | Wu | |
| 6,112,765 B1 | 9/2000 | Boyer | |
| 6,184,103 B1 * | 2/2001 | Li et al. ........................ 438/382 |
| 6,261,915 B1 | 7/2001 | Eklund et al. | |
| 6,265,746 B1 | 7/2001 | Madurawe et al. | |
| 6,285,238 B1 | 9/2001 | Wu | |
| 6,326,256 B1 | 12/2001 | Bailey et al. | |
| 6,392,468 B1 | 5/2002 | Wu | |
| 6,522,200 B2 | 2/2003 | Siniscalchi | |
| 6,542,419 B2 | 4/2003 | Hasegawa | |
| 6,876,594 B2 | 4/2005 | Griesmer et al. | |
| 7,008,833 B2 | 3/2006 | Li et al. | |
| 7,049,929 B1 | 5/2006 | Fjelstad | |
| 7,060,612 B2 | 6/2006 | Coolbaugh et al. | |
| 7,112,535 B2 | 9/2006 | Coolbaugh et al. | |
| 7,200,064 B1 | 4/2007 | Boerstler et al. | |
| 7,215,177 B2 | 5/2007 | Sueoka | |
| 7,242,072 B2 | 7/2007 | Kothandaraman et al. | |
| 7,268,577 B2 | 9/2007 | Erickson et al. | |

(Continued)

*Primary Examiner* — N Drew Richards
*Assistant Examiner* — Peter Bradford
(74) *Attorney, Agent, or Firm* — Cantor Colburn LLP; Vazken Alexanian

(57) ABSTRACT

A passive device structure includes an unpatterned metal gate layer formed in a passive device region of a semiconductor device; an insulator layer formed upon the unpatterned metal gate layer; a semiconductor layer formed upon the insulator layer; and one or more metal contact regions formed in the semiconductor layer; wherein the insulator layer prevents the metal gate layer as serving as a leakage current path for current flowing through a passive device defined by the semiconductor layer and the one or more metal contact regions.

14 Claims, 5 Drawing Sheets

U.S. PATENT DOCUMENTS

| | | | |
|---|---|---|---|
| 7,285,472 B2 | 10/2007 | Coolbaugh et al. | |
| 7,288,804 B2 | 10/2007 | Booth, Jr. et al. | |
| 7,307,911 B1 | 12/2007 | Anand et al. | |
| 7,315,193 B2 | 1/2008 | Anand et al. | |
| 7,323,761 B2 | 1/2008 | Park et al. | |
| 7,334,320 B2 | 2/2008 | Voldman | |
| 7,336,095 B2 | 2/2008 | Erickson et al. | |
| 7,339,400 B1 | 3/2008 | Walstrum, Jr. et al. | |
| 7,345,904 B1 | 3/2008 | Park et al. | |
| 7,345,943 B2 | 3/2008 | Wissel | |
| 7,382,036 B2 | 6/2008 | Nowak et al. | |
| 2004/0183157 A1* | 9/2004 | Wada et al. | 257/538 |
| 2006/0102963 A1 | 5/2006 | Huang | |
| 2006/0118885 A1* | 6/2006 | Song | 257/379 |
| 2009/0090977 A1* | 4/2009 | Freeman et al. | 257/379 |
| 2010/0006841 A1* | 1/2010 | Li et al. | 257/52 |
| 2011/0037128 A1* | 2/2011 | Chakravarti et al. | 257/379 |

* cited by examiner

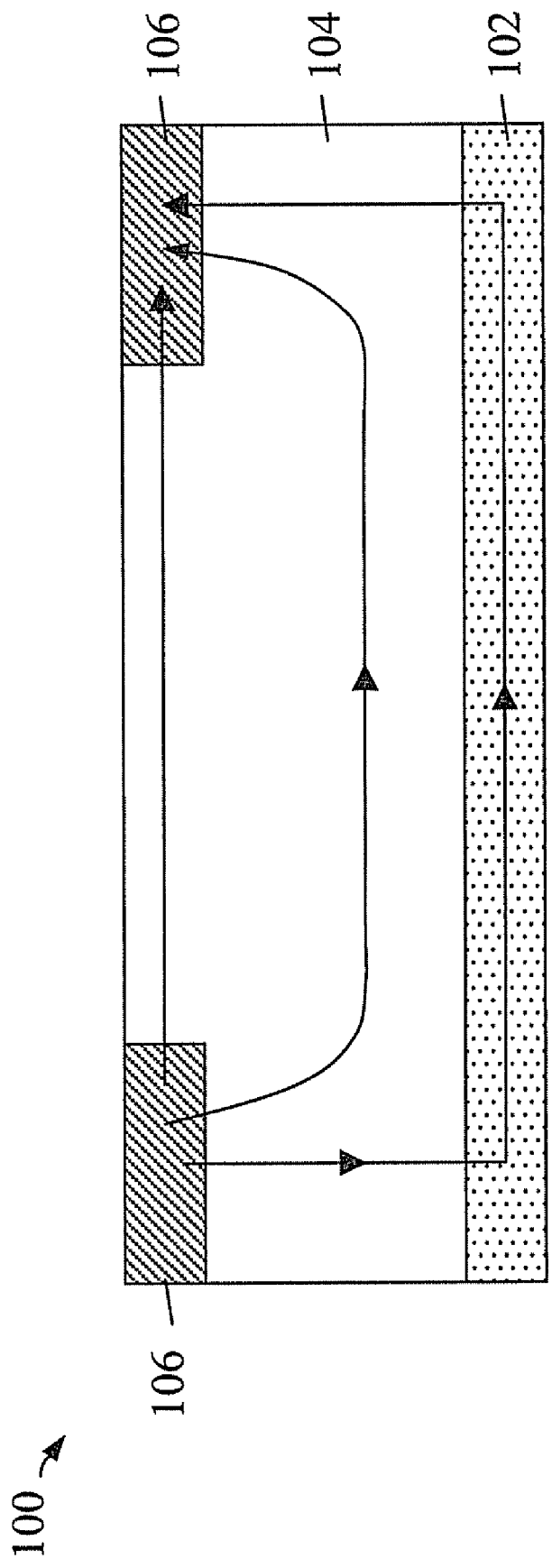
Fig. 1 – Prior Art

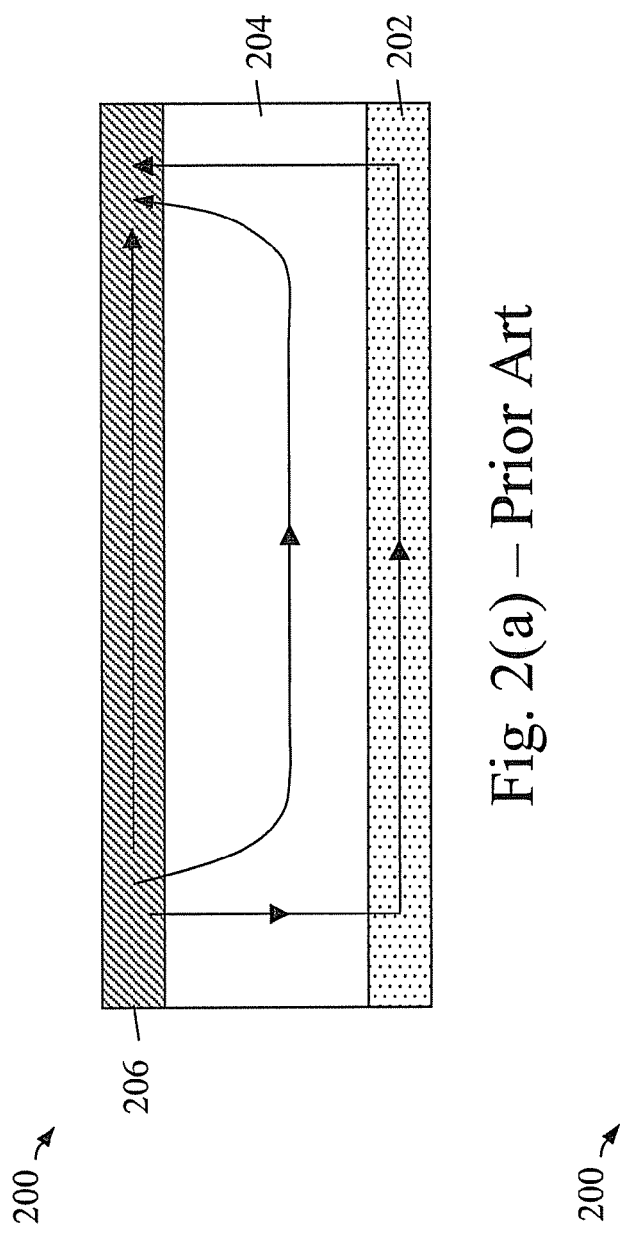
Fig. 2(a) – Prior Art
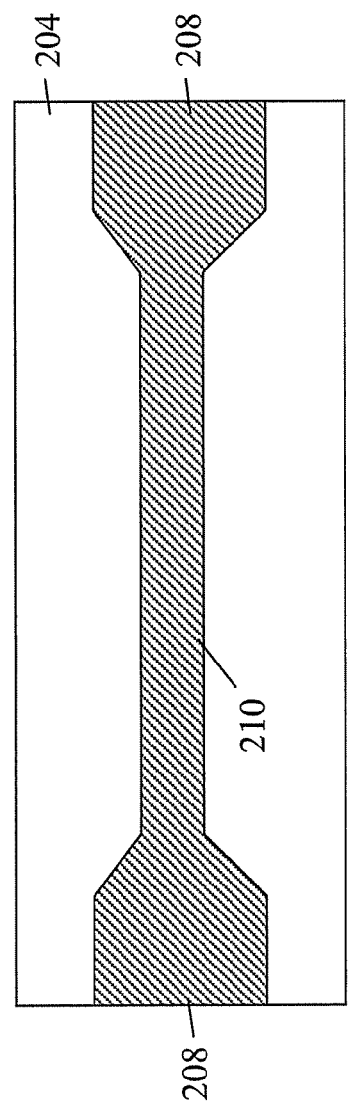
Fig. 2(b) – Prior Art

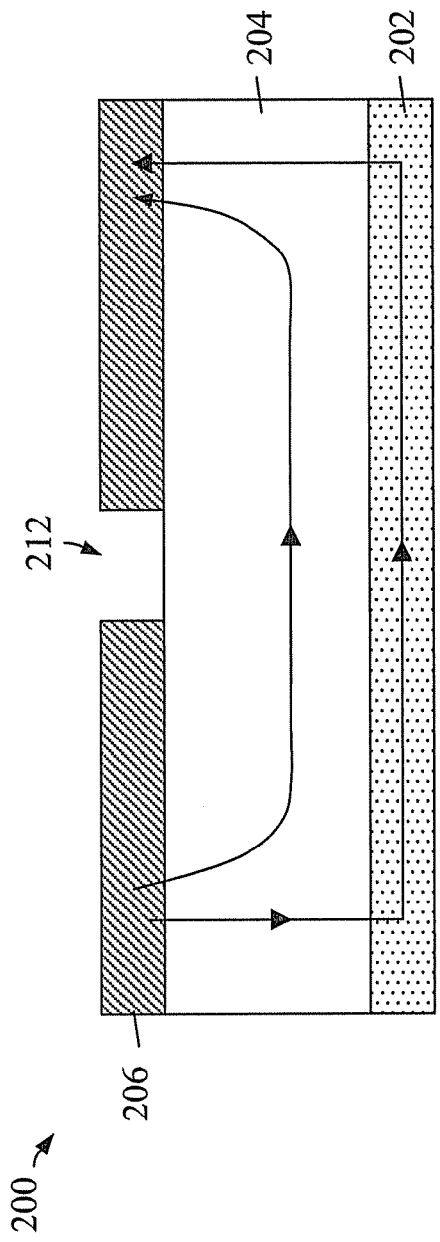
Fig. 2(c) – Prior Art
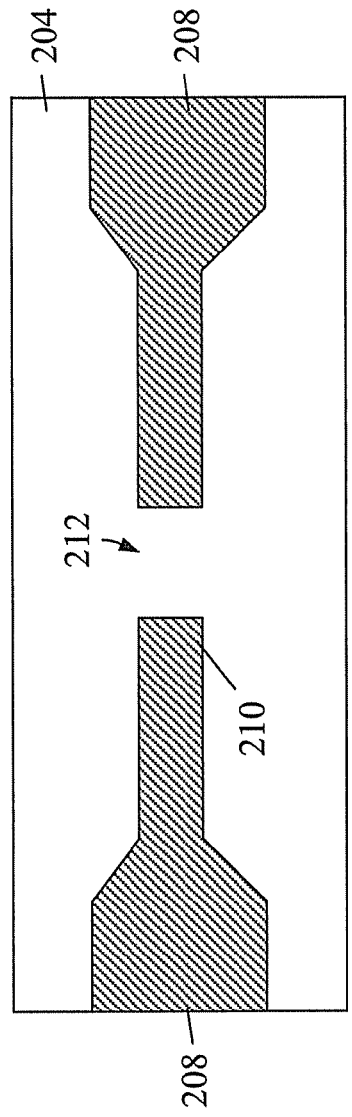
Fig. 2(d) – Prior Art

INTEGRATION OF PASSIVE DEVICE STRUCTURES WITH METAL GATE LAYERS

BACKGROUND

The present invention relates generally to semiconductor device manufacturing and, more particularly, to improved integration of passive device structures with metal gate layers.

In standard complementary metal oxide semiconductor (CMOS) devices, polysilicon is typically used as the standard gate material. The technology of fabricating CMOS devices using polysilicon gates has been in a constant state of development, and is now widely used in the semiconductor industry. One advantage of using polysilicon gates is that they can sustain high temperatures. However, there are also some problems associated with using a polysilicon gate. For example, due to the poly-depletion effect, polysilicon gates commonly used in CMOS devices are becoming a gating factor in chip performance for channel lengths of 0.1 micron and below. Another problem with polysilicon gates is that the dopant material in the polysilicon gate (e.g., boron) can easily diffuse through the thin gate dielectric causing further degradation of the device performance. Thus, one proposed way of improving the performance of sub-micron transistors is to use metal gates in place of conventional polysilicon gates, particularly with the advent of high-k gate dielectric materials.

In addition to transistor devices, other types of devices are also formed on integrated circuits. For example, certain passive device structures such as resistors and eFUSEs are formed above the substrate level. In particular, where such devices are integrated with metal gate technology, a silicon layer is formed on top of the metal gate layer (used in forming the metal gates in the transistor region). Thus, while the metal gate layer located in the transistor or active device regions is patterned according to a desired gate structure, the other portions of the metal gate layer residing in the passive device regions remain unpatterned and permanently reside below the passive device structures.

SUMMARY

In an exemplary embodiment, a passive device structure includes an unpatterned metal gate layer formed in a passive device region of a semiconductor device; an insulator layer formed upon the unpatterned metal gate layer; a semiconductor layer formed upon the insulator layer; and one or more metal contact regions formed in the semiconductor layer; wherein the insulator layer prevents the metal gate layer as serving as a leakage current path for current flowing through a passive device defined by the semiconductor layer and the one or more metal contact regions.

In another embodiment, a method of forming a passive device structure, includes forming an unpatterned metal gate layer in a passive device region of a semiconductor device; forming an insulator layer upon the unpatterned metal gate layer; forming a semiconductor layer upon the insulator layer; and forming one or more metal contact regions in the semiconductor layer; wherein the insulator layer prevents the metal gate layer as serving as a leakage current path for current flowing through a passive device defined by the semiconductor layer and the one or more metal contact regions.

BRIEF DESCRIPTION OF THE SEVERAL VIEWS OF THE DRAWINGS

Referring to the exemplary drawings wherein like elements are numbered alike in the several Figures:

FIG. 1 is a cross-sectional view of a cross-sectional view of an existing passive device structure formed over a metal gate layer;

FIG. 2(a) is a cross-sectional view of another existing passive device structure formed over a metal gate layer;

FIG. 2(b) is a top view of the passive device structure shown in FIG. 2(a);

FIG. 2(c) is a cross-sectional view of the passive device structure of FIG. 2(a) in a programmed state;

FIG. 2(d) is a top view of the passive device structure shown in FIG. 2(c);

DETAILED DESCRIPTION

Figure 3:
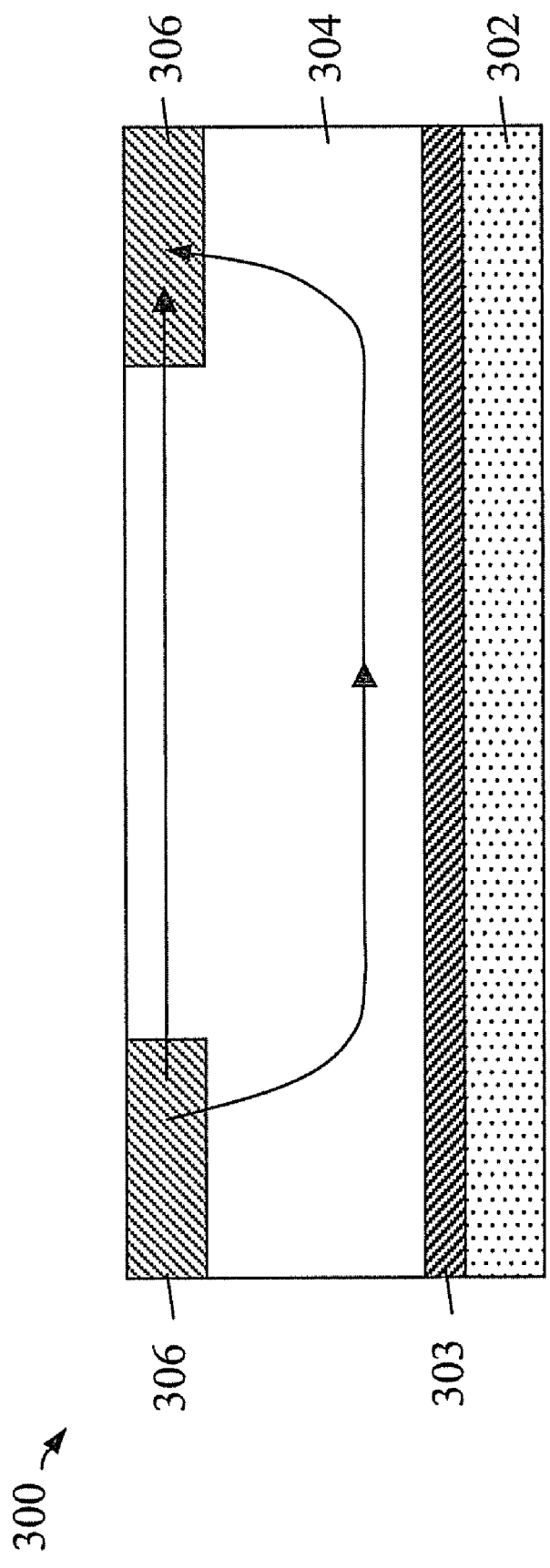
FIG. 3 is a cross-sectional view of a passive device structure formed over a metal gate layer, in accordance with an embodiment of the invention.

With the presence of a metal gate under a semiconductor (e.g., silicon) layer, the resulting resistor in passive device structures in effect becomes a parallel connection of the silicon resistance ($R_{si}$) and the metal gate resistance ($R_{metal}$), which lowers the resistance significantly. Moreover, changing the doping concentration in the silicon layer does not modulate the overall resistance to a substantial degree, since metal is much more conductive and dominates the total resistance. For example, the resistance of titanium nitride (TiN) is about 200 Ω/square, whereas passive devices require a target higher resistance (e.g., about 350 Ω/square) for 45 nm technology.

Accordingly, disclosed herein is a structure and method for improved integration of passive device structures with metal gate layers. In brief, an insulating layer such as aluminum oxide ($Al_2O_3$) is formed between the metal gate layer and the silicon layer, thus effectively preventing current from flowing from the passive device layer (e.g., silicon) into the metal gate layer and undesirably decreasing the passive device resistance. In turn the characteristics of the passive structure (e.g., resistor, eFUSE, etc.) may be determined by the silicon (semiconductor) layer, and not the combination of silicon and a metal layer therebeneath.

Referring initially to FIG. 1, there is shown a cross-sectional view of an existing passive device structure 100 formed over a metal gate layer 102. Here, the passive device structure 100 is a resistor formed in a semiconductor (e.g., polysilicon) layer 104 that may be doped in accordance with the desired characteristics (e.g., resistance value) of the device. Metal contact regions 106 (e.g., silicide) define opposing terminals of the resistor.

Ideally, the resistance of the doped semiconductor layer 104 dominates the total resistance of the passive device 100. However, as further shown in FIG. 1, in addition to the current paths from one metal contact region 106 to another through the semiconductor layer 104, there is also another current path substantially vertically down through the semiconductor layer 104, through the metal gate layer 102, back up through the semiconductor layer 104 and to the other metal contact region 106. As such, the total effective resistance of the passive device 100 becomes a parallel connection of the semiconductor layer resistance ($R_{si}$) and the metal gate resistance ($R_{metal}$).

Referring now to FIGS. 2(a) and 2(b), FIG. 2(a) is a cross-sectional view of another existing passive device structure 200 formed over a metal gate layer 202, while FIG. 2(b) is a top view thereof In this example, the passive device structure 200 is an eFUSE formed in a semiconductor (e.g., polysilicon) layer 204 and having a top metal strip 206 (e.g., silicide) characterized by wide terminal portions 208 and a thin neck portion 210 connecting the terminal portions 208. In one example, an unprogrammed or low-resistance state of the structure 200 leaves the top metal strip portion of the device intact, and thus the presence of the metal gate layer 202 does not have as much of an impact on the desired device resistance as was the case for FIG. 1.

On the other hand, in a programmed or "blown" state of the eFUSE device 200 as shown in FIGS. 2(c) and 2(d), a void 212 or hole is intentionally created in the neck portion 210 of the strip 206 (such as by laser ablation or passing a high current therethrough) in order to set the eFUSE to a high-resistance state. By severing the metal strip connection between the end terminals, the device 200 is ideally in a high-resistance state, where a small amount leakage current passes through the undoped semiconductor layer 204. However, as further shown in FIG. 2(c), the metal gate layer 202 once again provides a relatively low resistance parallel current path that can adversely affect desired device resistance characteristics.

Referring now to FIG. 3, there is shown a cross-sectional view of a passive device structure 300 formed over a metal gate layer 302, in accordance with an embodiment of the invention. In the embodiment shown, an electrically insulating layer 303 is formed over the metal gate layer 302 prior to deposition of the semiconductor layer 304. After formation of the insulator layer 303, the passive device (e.g., a resistor) is formed as known in the art such as by appropriate doping of the semiconductor layer 304 and silicide contact 306 formation to define opposing terminals of the passive device structure 300. As the passive device structure 300 is formed in a passive region of a semiconductor device, the metal gate layer 302 remains unpatterned therein.

The insulator layer 303 may be an oxide layer or any suitable layer that acts as a barrier for electrical current from flowing through semiconductor layer 304 into the metal gate layer 302 and lowering the desired resistance of the device 300. Exemplary suitable materials for the insulator layer 303 include, but are not limited to, aluminum oxide, zirconium oxide, hafnium oxide, hafnium silicate, silicon oxide, silicon nitride, lanthanum oxide, and combinations thereof. Further, the insulator layer 303 may be formed by any suitable techniques such as physical vapor deposition (PLD), atomic layer deposition (ALD) and the like.

An exemplary thickness for the insulator layer 303 may be on the order of about 10 to about 200 nanometers (nm), and more specifically about 10 to about 100 nm. In one specific example, a 12-angstrom (Å) layer of aluminum oxide ($Al_2O_3$) is shown to effectively block an amorphous silicon/metal gate layer conductive path and provide a resistance of about $6 \times 10^4$ Ω/square in the absence of doping in the silicon layer. Accordingly, specific resistance targets for passive devices may now be easily achieved through appropriate semiconductor layer doping, without adverse effects due to the now more common metal gate technology in CMOS devices.

Figure 4A:
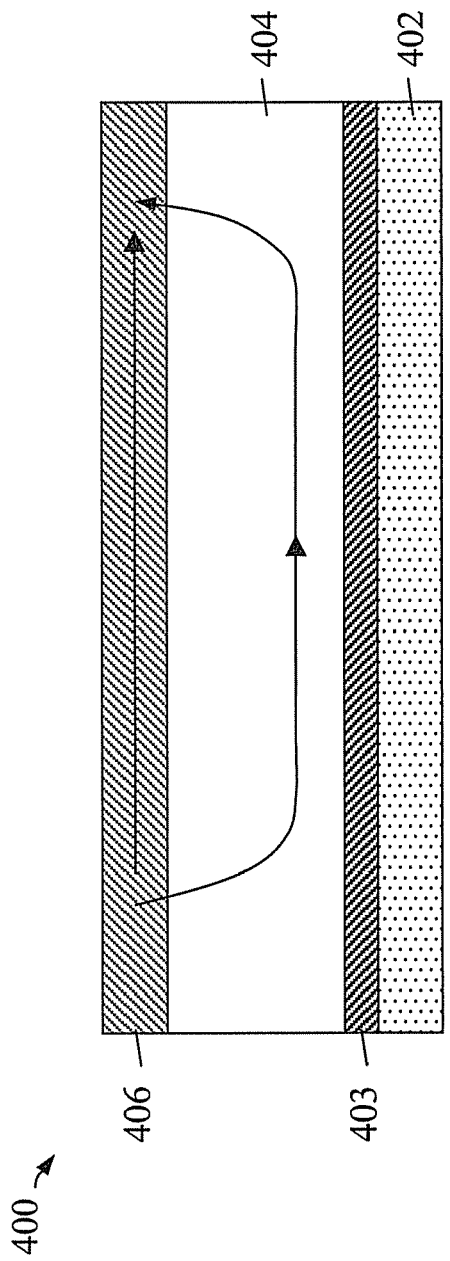
FIGS. 4(a) and 4(b) are cross-sectional views of a passive device structure formed over a metal gate layer, in accordance with another embodiment of the invention.
Figure 4B:
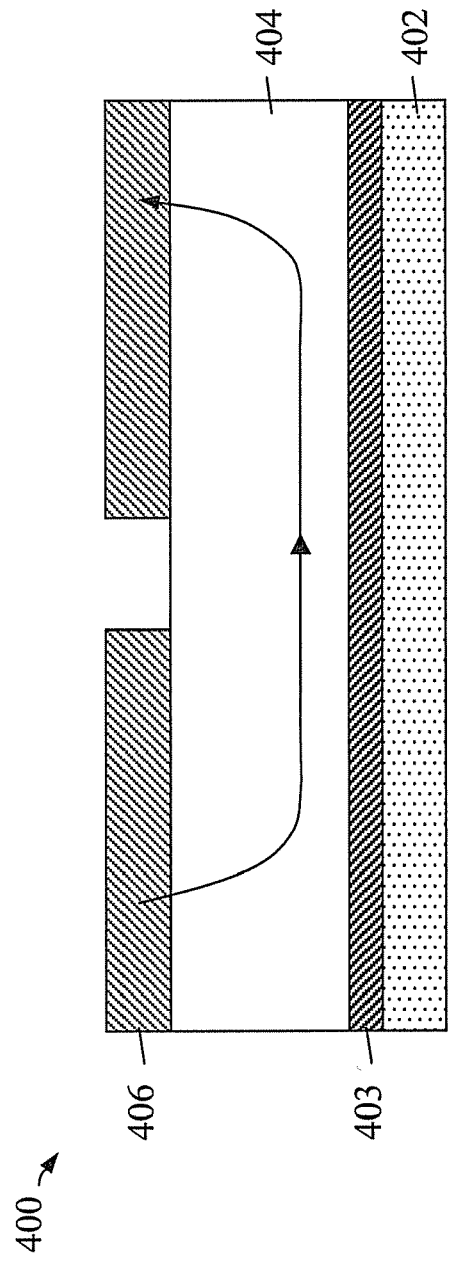

The effectiveness of the insulator 303 is also schematically shown in FIG. 3, where it is seen that no substantial leakage current path from the semiconductor layer 304 is allowed to pass through the metal gate layer 302. Finally, FIGS. 4(a) and 4(b) are cross-sectional views of a passive device structure 400 formed over a metal gate layer 402, in accordance with an embodiment of the invention. In this embodiment, the insulator layer 403 is formed over the metal gate layer 402 prior to deposition of the semiconductor layer 404 and formation of the passive device structure 406, which in this example is an eFUSE. In FIG. 4(a), the device 400 is in an unprogrammed state, whereas in FIG. 4(b), the device 400 is in a programmed or "blown" state. In either instance, it will be seen that no substantial leakage current path from the semiconductor layer 404 is allowed to pass through the metal gate layer 402.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A passive device structure, comprising:
    an unpatterned metal gate layer formed in a passive device region of a semiconductor device;
    an aluminum oxide ($Al_2O_3$) insulator layer formed upon the unpatterned metal gate layer;
    a semiconductor layer formed upon the insulator layer; and
    one or more metal contact regions formed in the semiconductor layer;
    wherein the insulator layer prevents the metal gate layer as serving as a leakage current path for current flowing through a passive device defined by the semiconductor layer and the one or more metal contact regions.

2. The passive device structure of claim 1, wherein the insulator layer has a thickness in the range of about 10 nanometers to about 200 nanometers (nm).

3. The passive device structure of claim 1, wherein the insulator layer has a thickness in the range of about 10 nanometers to about 100 nanometers (nm).

4. The passive device structure of claim 1, wherein the passive device comprises a resistor having a first terminal defined by a first of the one or more metal contact regions formed in the semiconductor layer, and a second terminal defined by a second of the one or more metal contact regions formed in the semiconductor layer.

5. The passive device structure of claim 1, wherein the passive device comprises an eFUSE device having a first terminal defined by a first end of the one or more metal contact regions formed in the semiconductor layer, and a second terminal defined by a second end of the one or more metal contact regions formed in the semiconductor layer.

6. The passive device structure of claim 1, wherein the one or more metal contact regions comprise silicide.

7. The passive device structure of claim 1, wherein the semiconductor layer comprises doped silicon.

8. A method of forming a passive device structure, the method comprising:
    forming an unpatterned metal gate layer in a passive device region of a semiconductor device;
    forming an aluminum oxide ($Al_2O_3$) insulator layer upon the unpatterned metal gate layer;
    forming a semiconductor layer upon the insulator layer; and
    forming one or more metal contact regions in the semiconductor layer;
    wherein the insulator layer prevents the metal gate layer as serving as a leakage current path for current flowing through a passive device defined by the semiconductor layer and the one or more metal contact regions.

9. The method of claim 8, wherein the insulator layer has a thickness in the range of about 10 nanometers to about 200 nanometers (nm).

10. The method of claim 8, wherein the insulator layer has a thickness in the range of about 10 nanometers to about 100 nanometers (nm).

11. The method of claim 8, wherein the passive device comprises a resistor having a first terminal defined by a first of the one or more metal contact regions formed in the semiconductor layer, and a second terminal defined by a second of the one or more metal contact regions formed in the semiconductor layer.

12. The method of claim 8, wherein the passive device comprises an eFUSE device having a first terminal defined by a first end of the one or more metal contact regions formed in the semiconductor layer, and a second terminal defined by a second end of the one or more metal contact regions formed in the semiconductor layer.

13. The method of claim 8, wherein the one or more metal contact regions comprise silicide.

14. The method of claim 8, wherein the semiconductor layer comprises doped silicon.

* * * * *